(12) United States Patent
Sanner et al.

(10) Patent No.: US 10,381,991 B1
(45) Date of Patent: Aug. 13, 2019

(54) DRAIN SHARING SPLIT LNA

(71) Applicant: pSemi Corporation, San Diego, CA (US)

(72) Inventors: Miles Sanner, San Diego, CA (US); Emre Ayranci, Costa Mesa, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 15/887,816

(22) Filed: Feb. 2, 2018

(51) Int. Cl.
| | | |
|---|---|---|
| *H03F 1/22* | (2006.01) | |
| *H03F 3/195* | (2006.01) | |
| *H03F 1/02* | (2006.01) | |
| *H04B 1/16* | (2006.01) | |

(52) U.S. Cl.
CPC .......... *H03F 3/195* (2013.01); *H03F 1/0211* (2013.01); *H03F 2200/111* (2013.01); *H03F 2200/222* (2013.01); *H03F 2200/231* (2013.01); *H03F 2200/267* (2013.01); *H03F 2200/294* (2013.01); *H03F 2200/387* (2013.01); *H03F 2200/396* (2013.01); *H03F 2200/451* (2013.01); *H03F 2200/492* (2013.01); *H04B 1/16* (2013.01)

(58) Field of Classification Search
CPC ............. H03F 1/22; H03F 1/223; H03F 1/226
USPC ................................................ 330/283, 311
See application file for complete search history.

(56) References Cited

U.S. PATENT DOCUMENTS

| | | |
|---|---|---|
| 6,804,502 B2 | 10/2004 | Burgener et al. |
| 7,910,993 B2 | 3/2011 | Brindle et al. |
| 2014/0113578 A1 * | 4/2014 | Xu ............... H03F 1/223 455/232.1 |
| 2014/0240048 A1 | 8/2014 | Youssef et al. |
| 2014/0266461 A1 | 9/2014 | Youssef et al. |
| 2015/0038093 A1 * | 2/2015 | Connell .......... H03F 1/223 455/77 |
| 2015/0263691 A1 | 9/2015 | Takahashi |
| 2018/0026592 A1 * | 1/2018 | Wallis ............ H01L 23/66 330/302 |

FOREIGN PATENT DOCUMENTS

WO 2016076962 5/2016

OTHER PUBLICATIONS

Fedi, Giulio, International Search Report and Written Opinion received from the EPO dated Apr. 29, 2019 for appln. No. PCT/US2019/015477, 12 pgs.

* cited by examiner

*Primary Examiner* — Steven J Mottola
(74) *Attorney, Agent, or Firm* — Jaquez Land Greenhaus LLP; Bruce W. Greenhaus, Esq.

(57) ABSTRACT

A receiver front end having low noise amplifiers (LNAs) is disclosed herein. A cascode having a "common source" configured input FET and a "common gate" configured output FET can be turned on or off using the gate of the output FET. A first switch is provided that allows a connection to be either established or broken between the source terminal of the input FET of each LNA. A drain switch is provided between the drain terminals of input FETs to place the input FETs in parallel. This increases the $g_m$ of the input stage of the amplifier, thus improving the noise figure of the amplifier.

36 Claims, 7 Drawing Sheets

DRAIN SHARING SPLIT LNA

BACKGROUND

(1) Technical Field

Various embodiments described herein relate to amplifiers and more particularly to low noise amplifiers for use in communications equipment.

(2) Background

The front end of a communications receiver typically includes a low noise amplifier ("LNA") that is responsible for providing the first stage amplification to a signal received within the communications receiver. The operational specifications of the LNA are very important to the overall quality of the communications receiver. Any noise or distortion introduced by the LNA will cause degradation of the overall receiver performance. Accordingly, the sensitivity of a receiver is, in large part, determined by the quality of the front end and in particular, by the quality of the LNA.

In some cases, the LNA is required to operate over a relatively broad frequency band and to amplify signals having several distinct modulated baseband or modulated intermediate frequency (IF) signals. One example of a situation in which the LNA is required to amplify a received signal having multiple modulated IF or baseband signals is the case in which an intraband noncontiguous carrier aggregation (CA) signal is to be received. A CA signal can have two channels (or IF carriers) having frequencies that are not adjacent to one another, but which lie within the frequency range that can be addressed by a single LNA amplifier. For example, a CA signal may have two non-adjacent channels within a cellular frequency band defined by 3rd Generation Partnership Project (3GPP). 3GPP is a well-known industry standard setting organization.

In the case in which a receiver is required to receive a CA signal, such as a cellular telephone that is compliant with the Release 11 of the 3GPP communications industry standard, the LNA typically amplifies the received signal and provides the amplified output signal to a passive splitter. FIG. 1 is an illustration of a portion of a cellular telephone front end in which an LNA 101 is coupled to a variable attenuator 103. A bypass switch 105 allows the variable attenuator to be optionally shunted. The signal is then coupled to a single pole, three throw mode selector switch 107 that allows the output of the LNA 101 to be selectively coupled to only a first downconverter and baseband circuitry (DBC) 109, a second DBC 111 or both the first and the second DBC 109, 111.

When the mode selector switch 107 is in the first position (i.e., Single Channel mode 1), the output of the LNA 101 is coupled directly to the first DBC 109. In the second position (i.e., Split mode), the output of the LNA 101 is coupled through a passive power splitter 113 to both the first and second DBC 109, 111. In the third position (i.e., Single Channel mode 2), the output of the LNA 101 is coupled to only the second DBC 111.

There are several limitations that arise from the architecture shown in FIG. 1. The first limitation is the amount of isolation that can be achieved between the first and second DBC 109, 111. Typically, a well-manufactured 3 dB splitter can achieve approximately 18-20 dB of isolation between outputs at the center frequency for which the splitter 113 is designed to operate. Signals that are cross-coupled from one DBC to the other will typically result in interference and distortion that will result in an overall reduction in sensitivity of the receiver.

Furthermore, passive splitters typically are designed to operate optimally in a relatively narrow frequency range. That is, passive splitters, by their nature are narrow band devices. As the frequency of the signal coupled through the splitter 113 deviates from the optimal frequency for which the splitter was designed, the output-to-output isolation will degrade. Due to the limitations of the splitters currently available, and because receivers that are designed to handle CA signals must operate in a relatively broad frequency range, the desired isolation between the DBCs 109, 111 is difficult to achieve.

Furthermore, power splitters such as the splitter 113 shown in FIG. 1, have significant loss. Since 3 dB power splitters split the power in half, even an ideal splitter will result in a 3 dB reduction in power presented to the DBCs 109, 111 in the Split mode compared to the Single Channel modes. In addition, most splitters will have an additional 1.0 to 1.5 dB of insertion loss. The insertion loss, like the output-to-output isolation, will typically get worse as the frequency of the signals applied deviates from the center frequency for which the splitter was designed to operate.

Still further, the losses encountered in the mode selection switch 107 and the splitter 113 lead to a need for more gain. This results in reductions in linearity (as typically characterized by measuring the "third order intercept") and degradation of the noise figure of the receiver when operating in Split mode.

Therefore, there is currently a need for a CA capable receiver front end that can operate in Split mode with high output-to-output isolation, without degraded third order intercept and noise figure, and with relatively low front end losses.

SUMMARY OF THE INVENTION

A receiver front end capable of receiving and processing intraband non-contiguous carrier aggregate (CA) signals using multiple low noise amplifiers (LNAs) is disclosed herein. In accordance with some embodiments of the disclosed method and apparatus, each of a plurality of amplifiers is an LNA configured as a cascode (i.e., a two-stage amplifier having two transistors, the first configured as a "common source" input transistor, e.g., input field effect transistor (FET), and the second configured in a "common gate" configuration as an output transistor, (e.g. output FET). In other embodiments, the LNA may have additional transistors (i.e., more than two stages and/or stacked transistors). The output transistor of each LNA can be turned on or off (i.e., by either using the gate of the output FET or opening a switch in the source of the input FET 254, 252). The gates of an input FET are coupled together to form a common input. However, in some embodiments, the gates of the two FETs can be separated to allow the gate of an input FET of an LNA for which the output transistor is turned off (i.e., FETs are not conducting current from drain terminal to source terminal) to be independently controlled to turn off the input FET. A first switch is provided that allows a connection to be either established or broken between the source terminal of the input FET of each LNA. In addition, a second switch allows a switchable gate-to-source and/or gate to ground capacitor to be selectively applied to the input FET of at least one of the LNAs. In some embodiments, an additional switch is provided that allows a source to ground degeneration inductor to be disconnected from the source terminal of an input FET of an LNA for which the output FET is turned off. Selectively turning the output FETs on and off allows the amplifier to operate in both a single mode and a split mode. Furthermore, use of the switches ensures that the input impedance to the amplifier is the same in single mode and in split mode. Still further, a drain switch is provided that couples the drain terminals of each input FET together during single mode. The switch is opened to decouple the drain terminals during split mode.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION OF THE INVENTION

Figure 1:
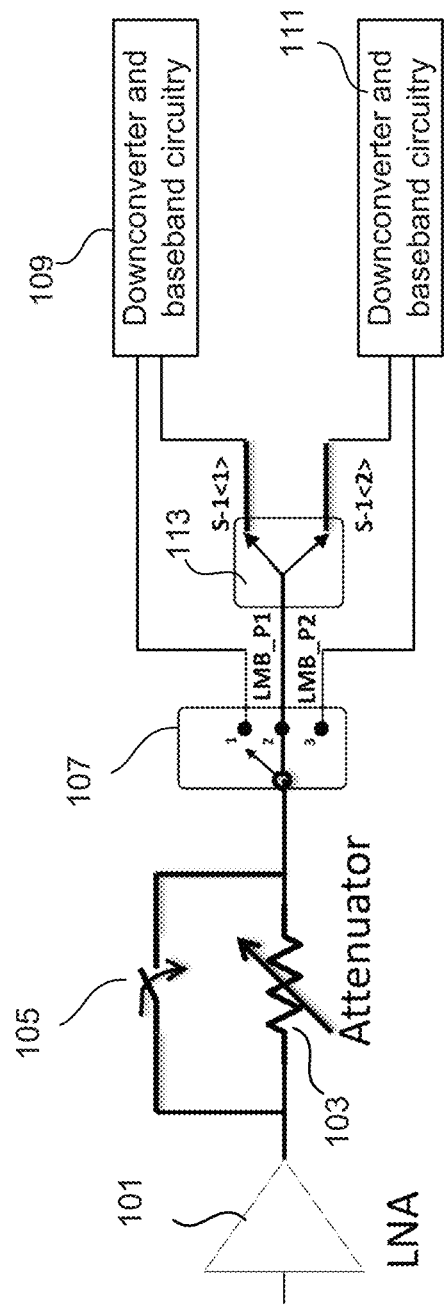
FIG. 1 is an illustration of a portion of a cellular telephone front end in which an LNA is coupled to a variable attenuator.
Figure 2:
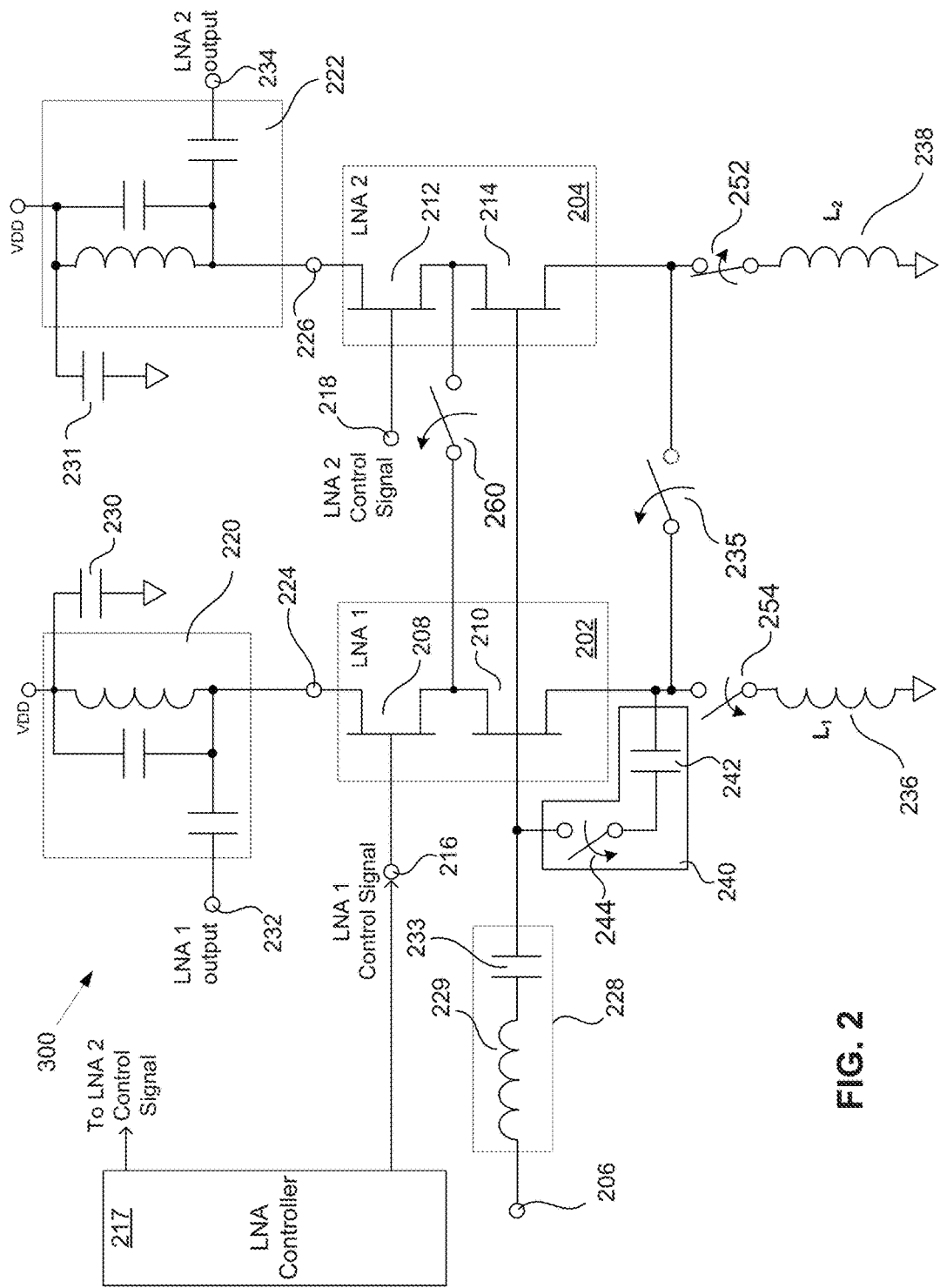
FIG. 2 is an illustration of a front end amplifier having degeneration switches, gate capacitor modules and using multiple LNAs operating in either single mode or split mode.

FIG. 2 is an illustration of a front end amplifier 200 of a communications receiver in which multiple low noise amplifiers (LNAs) 202, 204 are used to amplify signals. Signals to be amplified are coupled through a front end signal input terminal 206. In a first mode, referred to as "single mode", one of the output FETs 208, 212 associated with the LNAs 202, 204 is turned on (i.e., is actively amplifying a signal applied to the input of the LNA 202, 204). The amplified output of the active LNA 202, 204 is coupled to an output terminal 232, 234. The output FET 208, 212 of the other LNA 204, 202 is turned off (i.e., not allowing current to flow from drain to source). In one embodiment of the disclosed method and apparatus, each LNA 202, 204 comprises a pair of field effect transistors (FETs) 208, 210, and 212, 214. Each pair forms a two-stage LNA in a cascode architecture. However, it will be understood by those skilled in the art that other types of transistors may be used, including, but not limited to, bipolar junction transistors. Furthermore, any type of FET may be used to implement the LNA, including, but not limited to metal-oxide semiconductors (MOSFETs), junction field effect transistors (JFETs), insulated gate FETs (IGFETs), metal semiconductor FETs (MESFETs), etc. While some types of transistors may be better suited to particular applications, the concepts associated with the disclosed method and apparatus do not exclude the use of any particular type of transistor. Still further, additional transistors can be included within an LNA (e.g., LNA 202, 204), either as additional amplifier stages or stacked with those FETs 208, 212 that are shown. In addition, in some embodiments, the particular type of transistor and the number of such transistors can differ from one LNA 202, 204 to another or within each LNA 202, 204.

LNA control signals applied to control input terminals 216, 218 coupled to the gates of the output transistors (e.g., FETs) of the LNA implemented by the FETs 208, 212 control whether the output FETs 208, 212 of each LNA 202, 204 is on or off (i.e., conducting significant current from drain terminal to source terminal). In one embodiment, the LNA control signals are generated by a control module, such as an LNA Controller 217. The LNA Controller 217 may generate the LNA control signals based on information regarding the types of signals that will be received by the amplifier 200, the content carried by the signals, or based on user commands to select one or more channels. The LNA controller 217 may be a general purpose processor capable of receiving commands and processing the commands to generate control signals to the LNAs and associated switches disclosed throughout this disclosure. Alternatively, the LNA controller 217 is a dedicated processor specially designed for generating the control signals. Those skilled in the art will understand how to make such a processor for receiving a command to enter a first mode, such as split mode, and determine the particular configuration of switches and LNA control signals to be generated. In some cases, the LNA controller 217 may be as simple as a logic block with look-up table. Alternatively, in some embodiments, the LNA controller 217 may also rely upon additional information in determining the states of switch control and LNA control signals.

In single mode, the LNA control signal to one of the LNAs 202, 204 causes the output FET 208, 212 of that LNA 202, 204 to be turned on. The LNA control to the other LNA 204, 202 causes the output FET 212, 208 of that LNA 202, 204 to be turned off. In split mode, the output FETs 208, 212 of both LNAs 202, 204 are on. It will be understood by those skilled in the art that additional LNAs not shown in FIG. 2 could be coupled similarly to extend the amplifier to select additional channels using additional modes of operation.

Output load matching circuits 220, 222 coupled to the output ports 224, 226 of each LNA 202, 204 provide a means by which the output impedance can be matched to a load. In one case, an input matching circuit 228 is provided to match the input impedance of the amplifier to the source terminal. The input matching circuit 228 includes an input matching inductor 229 and an input DC block capacitor 233. In some embodiments, output shunt capacitors 230, 231 provide a relatively low capacitive reactance to ground for signals in the frequency range of the input signals applied to the input of the LNAs 202, 204, respectively. In some embodiments, separate $V_{DD}$ supply voltage sources can be provided for each LNA in order to increase the isolation between the LNAs 202, 204. In other embodiments, the same supply terminal can be used to provide $V_{DD}$ to two or more of the LNAs.

The isolation achieved by the front end 200 shown in FIG. 2 is enhanced by the fact that there is significant isolation between the output port 232 of the first LNA 202 and output port 234 of the second LNA 204. In the amplifier 200, the isolation between the outputs of the front end will improve for signals that are separated by several intervening channels. That is, as the separation in frequency increases, the level of gain-versus-frequency overlap of one narrow band-tuned output to the other will decrease. This decrease will enhance the isolation between the outputs. In lower gain modes of operation, the output isolation will improve.

One problem that needs to be addressed when using two LNAs in this manner is that the input impedance of the front end amplifier 200 will vary depending upon the mode in which the receiver is operated. That is, the input impedance presented in single mode will be significantly different from the impedance presented in split mode largely due to a difference in gate-to-source capacitance, Cgs, of the FET transistor when the output FET of the LNA is on and when the output FET of the LNA is off. A large difference in input impedances will cause a large input mismatch, which in turn creates large detrimental effects on virtually every aspect of the amplifier 200. The affect can result in an increase in noise figure, a reduction in gain, and a degradation in linearity as, for example, measured by third order intercept (IP3). The relatively large changes in the $C_{gs}$ of the input FET 210, 214 of each LNA 202, 204 from the conducting state to the non-conducting state result in large changes in both the real and imaginary parts of the input impedance of the amplifier 200 when operating in single mode versus split mode. A source switch 235 that can be closed in single mode to couple the source of the first input FET 210 to the source of the second input FET 214 is provided to reduce this affect. Closing the switch 235 to connect the sources of the two input FETs 210, 214 during single mode makes the input impedance presented in split mode (i.e., when the output FETs 208, 212 of both LNAs 202, 204 are turned on) much closer to the input impedance presented during single mode with the switch 235 open. However, this still represents a large impedance change as compared to split mode. In split mode, the source switch 235 is opened. Opening the source switch 235 during split mode improves the noise isolation between the outputs 216, 218.

In addition to the source switch 235, in some embodiments, the front end amplifier 200 has at least one gate capacitance module 240 comprising a gate capacitor 242 and a gate switch 244 connected in series between a first and second terminal of the module 240. The gate switch 244 can be switched to insert the gate capacitor 242 in parallel with the gate and source of the input FET 210 to provide additional input capacitance when the second LNA 204 is off. By adding the additional capacitance of the gate capacitor 242, the input impedance during single mode more closely matches the input impedance during split mode. Therefore, with both the gate switch 244 and the source switch 235 closed during single mode, the input impedance will very nearly match the input impedance present during split mode (during which both the switches 244, 235 are opened). In single mode, the gate switch 244 and the source switch 235 are closed. In split mode, the gate switch 244 and the source switch 235 are open.

In addition, the front end amplifier 200 has at least a first degeneration switch 252 to disconnect a degeneration component, such as a first degeneration inductor 238, from the second LNA 204 during single mode. In some embodiments, a second degeneration switch 254 is placed between the source of the first FET 210 and a second degeneration component, such as a second degeneration inductor 236, to allow the degeneration inductor 236 to be removed from the LNA 400. Accordingly, selection can be made as to which inductor 236, 238 to remove during single mode. It will be clear to those of ordinary skill in the art that either of the two degeneration switches 252, 254 can be provided alone or the two switches 252, 254 may both be provided together.

A degeneration inductor 236, 238 is disconnected when the source switch 235 is closed. Therefore, when the source switch 235 is open during split mode, each LNA 202, 204 sees only the inductance of the one degeneration inductor 236, 238 that is coupled to the respective source of the input FET 210, 214 associated with that LNA 202, 204. By opening one of the degeneration switches 252, 254 in single mode, the active LNA 202, 214 operating in single mode has an inductive load between the source and ground that is equal to the inductance of just one of the degeneration inductors 236, 238, thus more closely matching the inductance presented during split mode. Providing a second degeneration switch 254 provides flexibility as to which inductance to present at the source of the active input FET 210, 214 no matter which output FET 208, 212 is turned on during single mode.

In addition to the switches 235, 244, 252, 254, a drain switch 260 is provided to enable the drain terminal of the input FET 210 to be coupled to the drain terminal of the input FET 214 during single mode. In an amplifier operating in single mode without a drain switch 260, the input of one of the input FETs 210, 214 is essentially unused. Closing the drain switch 260 places the two input FETs 210, 214 in parallel. By placing the two input FETs 210, 214 in parallel, the unused input FET 210, 214 adds to the $g_m$ (i.e., transconductance) of the input stage of the front end amplifier 200. Transconductance is the change in the drain current divided by the small change in the gate to source voltage with a constant drain to source voltage. In this case, the drain current is the sum of the currents through each input FET 210, 214 (i.e., the current through the FET 208, 212 that is conducting). Increases in the $g_m$ of the amplifier result in an increase in the noise figure of the amplifier. The transition frequency is $f_T \approx g_m (2\pi C_{gs})$. Therefore, because the value of $C_{gs}$ is largely unchanged, the transition frequency ($f_T$) increases with an increase in $g_m$.

When signals are routed to the LNA 1 output, the LNA 1 control signal applied to the input 216 of the FET 208 provides bias to allow the FET 208 to conduct. The LNA 2 control signal applied to the input of the FET 212 is at ground potential to prevent the FET 212 from conducting. By closing the drain switch 260, the drain terminal of the input FET 214 conducts in parallel with the input FET 210, shunting some of the current that flows through the FET 208. It can be seen that essentially twice as much current will flow through the FET 208, since both the input FETs 210, 214 are conducting (assuming that $R_{on}$ of the drain switch 260 is relatively low and the two LNAs 202, 204 are essentially the same). Doubling the overall current draw while maintaining the same current through both input FETs 210, 214, doubles the effective input device $f_T$. However, the input FET 214 needs additional DC bias current to create $g_m$. and so the amplifier 200 will consume more power with both input FETs 210, 214 conducting. The bias of the input FETs 210, 214 can be set to optimize $f_T$ vs. power consumption. Accordingly, the amplifier 200 is flexible in its operation allowing the user to determine how to balance the tradeoff between power consumption and noise figure in single mode.

The drain switch 260 has a minimal impact on the operation of the amplifier 200 in split mode, since the drain switch 260 is open (i.e., not conducting) during split mode. The effect of $C_{off}$ (capacitance of the drain switch 260 when not conducting) on the forward signal is minimal, since the LNAs 202, 204 operate in common mode. However, If the drain switch 260 is too large, it can negatively impact the isolation of the outputs LNA output 1 and LNA output 2 in split mode. Furthermore, a large drain switch 260 increases the shunt capacitance to the substrate on which the components of the amplifier 200 are fabricated. Such an increase in shunt capacitance can increase the noise contribution from the cascode. The use of SOI integrated circuitry mitigates this affect to some degree, since additional shunt capacitance added is typically relatively small for silicon on insulator (SOI) integrated circuits.

In addition, the size of the drain switch 260 can have an impact on the noise figure. If the drain switch 260 is too small, the DC voltage drop across $R_{on}$ of the drain switch 260 (i.e., the resistance through the switch when the switch is closed) results in a decrease in the voltage $V_{DS}$ across the input FET 214. This results in a less efficient $g_m$ which will have a negative impact on noise figure. Nonetheless, because $R_{on}$ is presented after the $g_m$ stage, the contribution of $R_{on}$ to the noise figure is not very significant.

Figure 3:
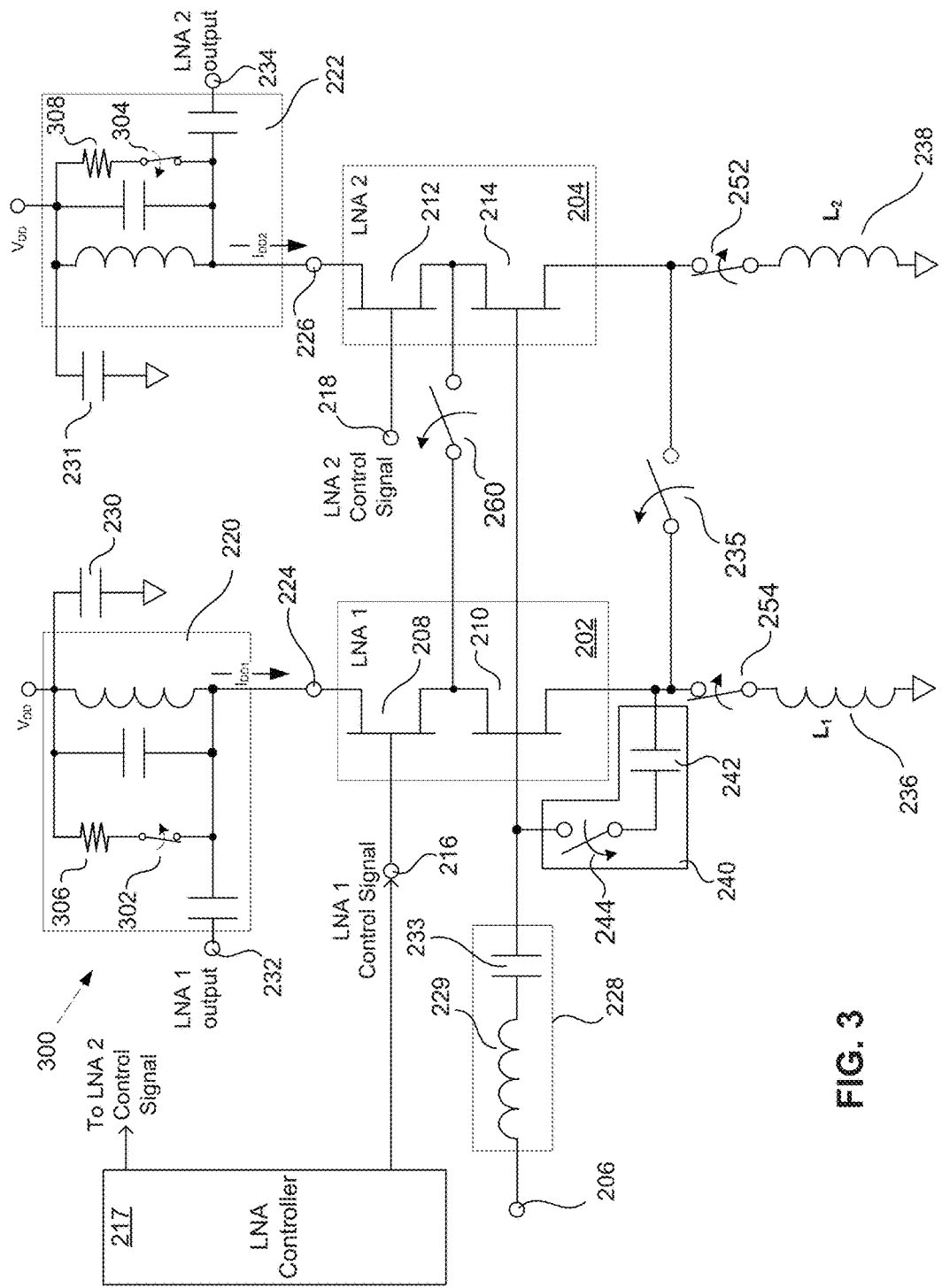
FIG. 3 is a simplified schematic of another embodiment of an amplifier having source split LNAs and a drain switch and including a resistance that can selectively be placed in parallel across an inductor and capacitor in each output load matching circuit.

FIG. 3 is a simplified schematic of another embodiment of an amplifier 300 having source split LNAs 202, 204 and a drain switch 260. The amplifier 300 includes a resistance that can selectively be placed in parallel across the inductor and capacitor in each of the output load matching circuits 220, 222. Within each output load matching circuits 220, 222, a switch 302, 304 is coupled in series with a drain resistance 306, 308 between the drain terminal of one of the output ports 224, 226 and $V_{DD}$. In single mode, the output impedance of the amplifier 300 drops due to the input FETs 210, 214 being placed in parallel when the drain switch 260 is closed. Opening the switches 302, 304 increases the resistance by removing the parallel path through each of the drain resistances 306, 308.

Figure 4:
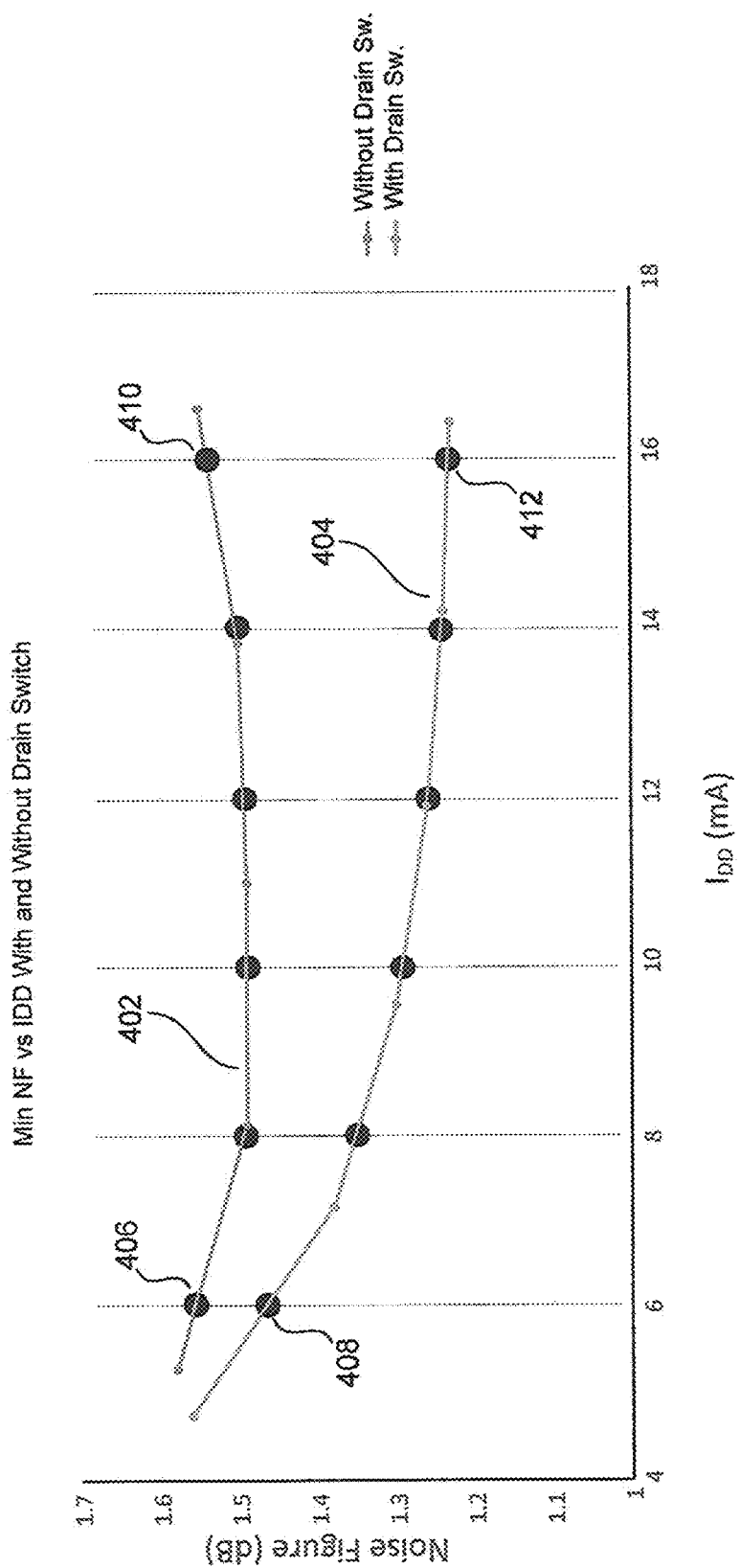
FIG. 4 is a graph illustrating the improvement in noise figure attained by using the drain switch.

FIG. 4 is a graph illustrating the improvement in noise figure attained by using the drain switch 260. A first curve 402 shows the noise figure associated with each level of current $I_{DD}$ drawn from the voltage source $V_{DD}$ during single mode with the drain switch open. In the case of the embodiment shown in FIG. 3, the current $I_{DD}$ is either: (1) the current $I_{DD1}$ flowing through the first LNA 202 when the LNA1 control signal is set to turn on the output FET 208 of LNA1 and any leakage current $I_{DD2}$ flowing through the second LNA 204; or (2) the current $I_{DD2}$ flowing through the second LNA 204 when the LNA2 control signal is set to turn on the output FET 212 of LNA2 and any leakage current $I_{DD1}$ flowing through the first LNA 202. A second curve 404 shows the noise figure associated with each level of current $I_{DD}$ drawn from the voltage source $V_{DD}$ in single mode with the drain switch closed. It can be seen that at a point 406 on the curve 402 at which the current $I_{DD}$ is equal to 6 mA, the noise figure with the drain switch open is approximately 1.55 dB. In contrast, at the point 408 the noise figure with the drain switch 260 closed is approximately 1.46 dB. The improvement in noise figure increases with greater $I_{DD}$. With the current $I_{DD}$ is 16 mA, the noise figure with the drain switch 260 open is shown at point 410 to be approximately 1.53 dB. In contrast, the noise figure with the drain switch 260 closed shown at point 412 is approximately 1.23 dB. It should be noted that these curves were plotted from an amplifier 300 having nominal values for the components and is meant merely to give a relative scale to the amount of improvement attainable. Amplifiers with components having particular values and characteristics may vary from these numbers.

Figure 5:
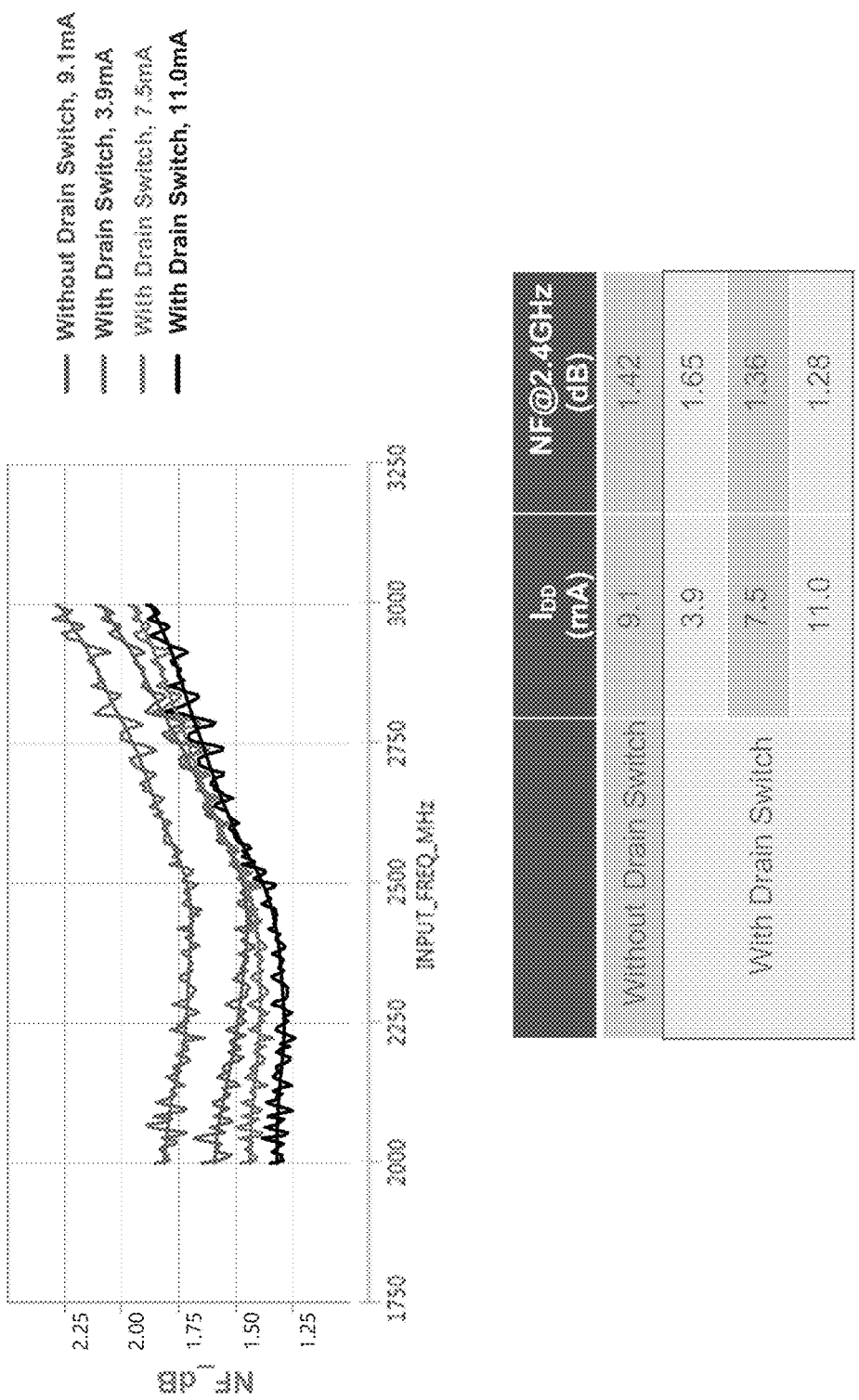
FIG. 5 is a graph and chart showing the relationship between the current $I_{DD}$ and noise figure as a function of input frequency.

FIG. 5 is a graph and chart showing the relationship between the current $I_{DD}$ and noise figure as a function of input frequency. Four curves 502, 504, 506, 508 are shown plotted over a frequency range from 2 GHz to 3 GHz. The first curve 502 represents a current $I_{DD}$ equal to 9.1 mA with the drain switch open over the frequencies from 2 GHz to 3 GHz. The second curve 504 illustrates the noise figure over the frequency range for a current $I_{DD}$ of 3.9 mA with the drain switch 260 closed. The third curve 506 illustrates the noise figure over the frequency range for a current $I_{DD}$ of 7.59 mA with the drain switch 260 closed. The fourth curve 508 illustrates the noise figure over the frequency range for a current $I_{DD}$ of 11.0 mA with the drain switch 260 closed. It can be seen that with the drain switch 260 closed, nearly the same noise figure can be attained with only 7.5 mA of $I_{DD}$ compared to 9.1 mA with the drain switch 260 open.

In accordance with some embodiments of the disclosed method and apparatus, the switches 235, 244, 252, 254, 260, 302, 304 can be manufactured in accordance with techniques provided in U.S. Pat. No. 6,804,502 (the "502 patent"), which is incorporated by reference herein, and disclosed in other related patents. Additional improvements in the performance of one or more of the switches 235, 244, 252, 254, 260, 302, 304 can be attained by implementing the techniques provided in U.S. Pat. No. 7,910,993 (the "993 patent"), which is incorporated by reference herein, and disclosed in other related patents. Use of such high performance switches reduces the non-linearity of the switches and thus the adverse effects of such switches on the performance of the receiver. However, in many implementations, it may be possible to use switches that have performance characteristics (i.e., linearity, return loss, switching speed, ease of integration, etc.) that are not as good as the characteristics of switches made in accordance with the techniques disclosed in the '502 and '993 patents. Accordingly, each or some of the switches disclosed above can be implemented using any combination of one or more transistors, including FETs, bipolar junction transistors (BJTs), or any other semiconductor switch. Alternatively, the switches can be implemented by electromechanical or MEMs (Micro-Electro-Mechanical Systems) technologies.

In addition, it will be understood by those skilled in the art that each of the switches 235, 244, 252, 254, 260, 302, 304 can be controlled by a control signal generated by the LNA controller 217 or other such controller to select the state of each switch as a function of the mode of operation of the amplifier (i.e., whether in single mode or split mode). Such control signals and inputs to the switches are not shown for the sake of simplicity in the figures, but are well within the understanding of those skilled in the art.

Methods

Figure 6:
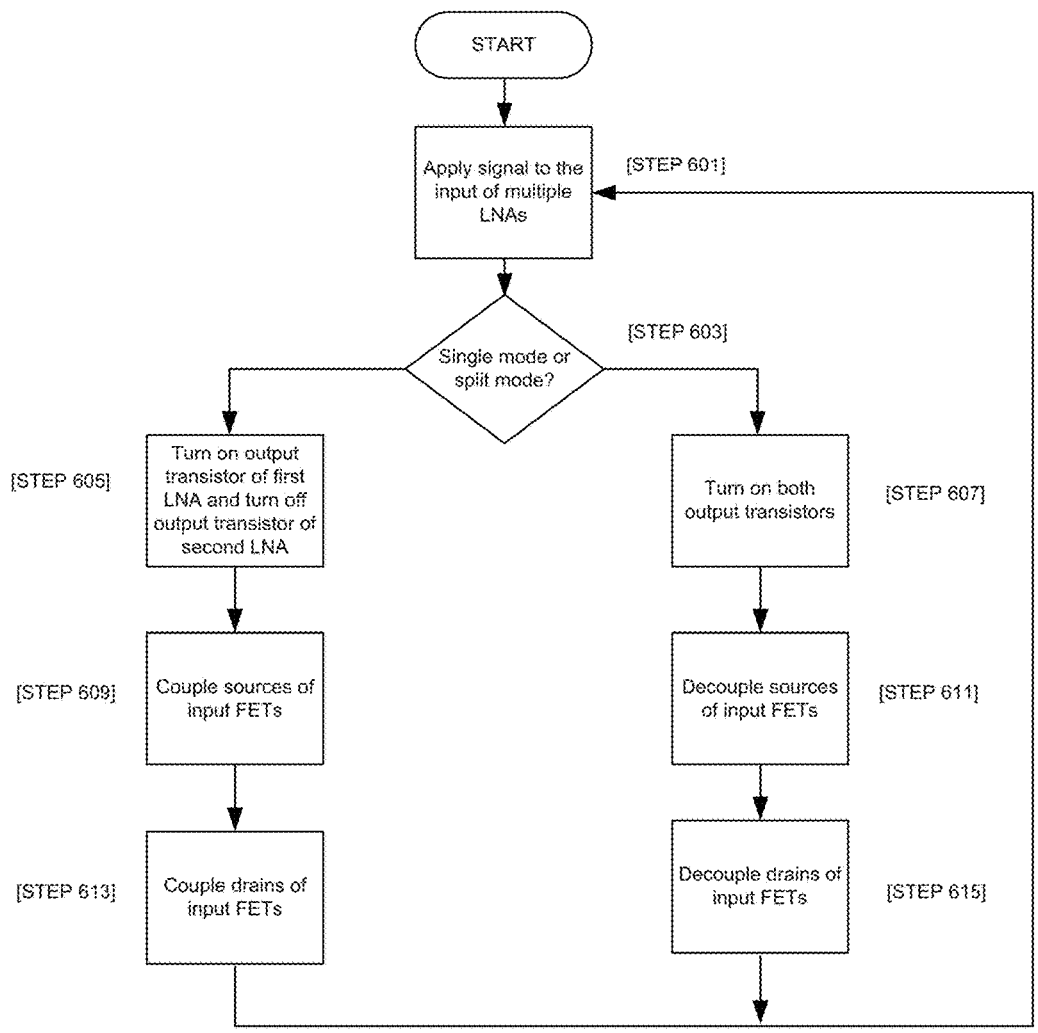
FIG. 6 illustrates a method in accordance with one embodiment for amplifying a signal (e.g., a CA signal) using more than one amplifier.

FIG. 6 is an illustration of a method in accordance with one embodiment for amplifying a signal (e.g., a CA signal) using more than one amplifier. The signal is applied to the input of the amplifiers [STEP 601]. In some embodiments, the signal includes a first and a second non-adjacent channel. The first and second channels are considered to be non-adjacent if there is at least a narrow frequency range between the defined end of the frequency range of the first channel and the defined beginning of the frequency range of the second channel. Typically, at least a third channel is defined within the frequency range between the end of the first and beginning of the second channel. The frequency range of a channel is typically defined by industry standards, but in some cases may be defined by the 3 dB frequency range of filters commonly used to receive signals transmitted over the channel.

The method further includes selecting between a single mode or a split mode [STEP 603]. In one embodiment, the selection between single mode and split mode is made by turning on an output FET 208 in a first LNA 202 and turning off a second output FET 121 within a second LNA 204 to select single mode [STEP 605]. In one such embodiment, the first output FET 208 is turned on by applying an LNA control signal to a first control input terminal 216 coupled to the gate of the output FET, such as the FET 208 shown in FIGS. 2-5. The second output FET 212 is turned off by applying an LNA control signal to a second control input terminal 218. Similarly, the selection of split mode is made by applying LNA control signals to the control terminals 216, 218 to turn both output FETs 208, 212 on [STEP 607].

The method further includes coupling the source of an input FET of the first LNA 202, such as FET 210 and the source of an input FET of the second LNA 204, such as the FET 212, during single mode [STEP 609] and decoupling the two sources during split mode [STEP 611]. In one such embodiment, a source switch 235 is closed in single mode and opened in split mode. When closed, the source switch 235 couples the two sources of the input FETs 210, 212. Furthermore, the drain switch 260 is closed in single mode [STEP 613] and opened during split mode [STEP 615].

Figure 7:
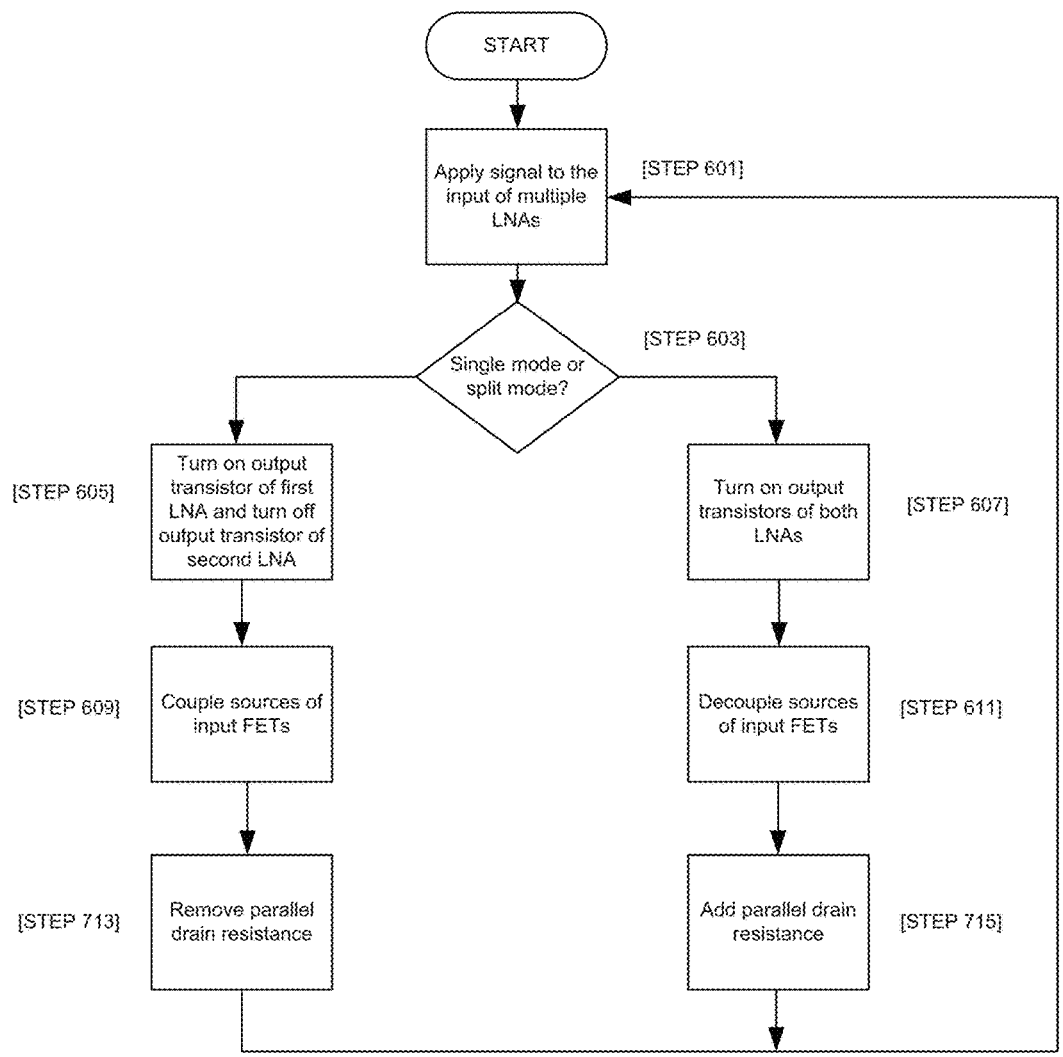
FIG. 7 is an illustration of another embodiment of a method that includes removing parallel drain resistances during single mode.

FIG. 7 is an illustration of another embodiment of a method that includes removing parallel drain resistances 306, 308 during single mode [STEP 713]. In one embodiment, the drain resistances are removed by opening switches 302, 304. The resistances 306, 308 are added during split mode [STEP 715] by closing the switches 302, 304. One such embodiment further includes selecting the resistance value of the drain resistances such that the output impedance is essentially the same during single mode and split mode.

Fabrication Technologies and Options

As should be readily apparent to one of ordinary skill in the art, various embodiments of the claimed invention can be implemented to meet a wide variety of specifications. Unless otherwise noted above, selection of suitable component values is a matter of design choice and various embodiments of the claimed invention may be implemented in any suitable IC technology (including but not limited to MOSFET and IGFET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaN HEMT, GaAs pHEMT, and MESFET technologies. However, in some cases, the inventive concepts claimed may be particularly useful with an SOI-based fabrication process (including SOS), and with fabrication processes having similar characteristics.

A number of embodiments of the claimed invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion. It is to be understood that the foregoing description is intended to illustrate and not to limit the scope of the claimed invention, which is defined by the scope of the following claims, and that other embodiments are within the scope of the claims.

What is claimed is:

1. An amplifier including:
   (a) a plurality of low noise amplifiers (LNA), each including an input transistor and an output transistor;
   (b) at least two control input terminals, each coupled to an output transistor of a corresponding one of the LNAs; and
   (c) at least one drain switch having a first terminal coupled to the source of a first of the output transistors and to the drain of a first of the input transistors and a second terminal coupled to the source of a second of the output transistors and to the drain of a second of the input transistors, the at least one drain switch connecting drain terminals of the first and second input transistors of at least two of the LNAs during a first mode of operation and disconnecting the drain terminals during at least a second mode of operation.

2. The amplifier of claim 1, further comprising at least one source switch connecting source terminals of the input transistors of at least two of the LNAs during a first mode of operation and disconnecting the source terminals during at least a second mode of operation.

3. The amplifier of claim 1, wherein signals coupled to the control input terminals turn the corresponding output transistor on and off.

4. The amplifier of claim 1, further including a gate capacitance module, the gate capacitance module having a first and second terminal, the first terminal coupled to the gate of an associated one of the input transistors and the second terminal coupled to the source of the associated input transistor.

5. The amplifier of claim 4, further including a control module having at least one switch control signal output, wherein each drain switch has a switch control signal input to which a corresponding switch control signal output is coupled.

6. The amplifier of claim 4, wherein each gate capacitance module includes a gate capacitor and a gate switch coupled in series between the first terminal and the second terminal of the gate capacitance module.

7. The amplifier of claim 6, wherein the gate switch is open when the associated transistor is conducting and closed when the associated transistor is not conducting.

8. The amplifier of claim 1, further including at least one gate capacitance module, each gate capacitance module having a first and second terminal, the first terminal coupled to the gate of an associated one of the input transistors and the second terminal coupled to ground.

9. The amplifier of claim 8, further including a control module having at least one switch control signal output, wherein each gate capacitance module has a switch control signal input to which a corresponding switch control signal output is coupled.

10. The amplifier of claim 8, wherein each gate capacitance module includes a gate capacitor and a gate switch coupled in series between the first terminal and the second terminal of the gate capacitance module.

11. The amplifier of claim 10, wherein the gate switch is open when the associated input transistor is on and closed when the associated input transistor is off.

12. The amplifier of claim 1, further including:
   (a) a degeneration component;
   (b) a degeneration switch coupled in series with the degeneration component, the series combination of the degeneration component and degeneration switch coupled between the source of one of the input transistors and circuit ground.

13. The amplifier of claim 12, wherein the degeneration component is a degeneration inductor.

14. The amplifier of claim 12, wherein the degeneration switch is open when the drain switch is closed and closed when the drain switch is open.

15. The amplifier of claim 12, further including at least a second degeneration component and a second degeneration switch, the second degeneration component and second degeneration switch coupled in series between the source of a second input transistor and ground, and the second degeneration switch being closed when the first degeneration switch is open.

16. The amplifier of claim 12, further including a control module having a switch control signal output, wherein the degeneration switch has a switch control signal input to which the switch control signal output is coupled.

17. The amplifier of claim 4, further including:
(a) a degeneration component;
(b) a degeneration switch coupled in series with the degeneration component, the series combination of the degeneration component and degeneration switch coupled between the source of one of the input transistors ground.

18. The amplifier of claim 17, wherein the degeneration component is an inductor.

19. The amplifier of claim 17,
wherein each gate capacitance module includes a gate capacitor and a gate switch coupled in series between the first terminal and the second terminal of the gate capacitance module,
wherein the degeneration switch is open when the drain switch is closed and closed when the drain switch is open and
wherein the gate switch is closed when the drain switch is closed and open when the drain switch is open.

20. The amplifier of claim 17, further including at least a second degeneration inductor and a second degeneration switch,
wherein each gate capacitance module includes a gate capacitor and a gate switch coupled in series between the first terminal and the second terminal of the gate capacitance module,
wherein the degeneration switch is open when the drain switch is closed and closed when the drain switch is open,
wherein the gate switch is closed when the drain switch is closed and open when the drain switch is open and
wherein the second degeneration inductor and second degeneration switch are coupled in series between the source of a second input transistor and ground, and the second degeneration switch being closed when the first degeneration switch is open.

21. The amplifier of claim 17, further including a control module having switch control signal outputs, wherein the degeneration switch has a switch control signal input to which one of the switch control signal outputs is coupled and each gate capacitance module has a switch control signal input to which one of the switch control signal outputs is coupled.

22. A method for amplifying a signal in more than one amplifier including:
(a) coupling the signal to be amplified to the input of at least a first and second LNA, each LNA having an input transistor and an output transistor, each transistor having a first terminal, a second terminal and a third terminal;
(b) coupling the second terminal of the output transistor of the first LNA to the third terminal of the input transistor of the first LNA;
(c) coupling the second terminal of the output transistor of the second LNA to the third terminal of the input transistor of the second LNA;
(d) turning on the output transistors of the first and second LNAs during a first mode;
(e) opening a switch between the third terminal of the input transistor of the first LNA and the third terminal of the input transistor of the second LNA during the first mode;
(f) turning off one of the output transistors during a second mode; and
(g) closing the switch between the third terminal of the first and second input transistors in the second mode.

23. The method of claim 22, further including:
(a) opening a switch between the second terminal of the first transistor and the second terminal of the second transistor during the first mode; and
(b) closing the switch between the second terminal of the first and second transistors in the second mode.

24. The method of claim 22, further including closing a gate switch to place a capacitance between the first terminal of the first transistor and the second terminal of the first transistor during the second mode when the LNA having the first transistor is off.

25. The method of claim 24, further including opening the switch to remove the capacitor from between the first terminal of the first transistor and the second terminal of the first transistor during the first mode.

26. The method of claim 25, wherein the capacitance of the capacitor is selected such that the input impedance seen looking into the LNA is essentially the same during the first mode as during the second mode.

27. The method of claim 25, wherein the first and second transistor are field effect transistors and the first terminal is the gate, the second terminal is the source and the third terminal is the drain.

28. The method of claim 22, further including closing a gate switch to place a capacitor between the first terminal of the first transistor and ground during the second mode if the LNA having the first transistor is off.

29. The method of claim 28, further including opening a switch to disconnect a capacitor from between the first terminal of the first transistor and ground during the first mode.

30. The method of claim 29, wherein the capacitance of the capacitor is selected such that an input impedance seen looking into the LNA is essentially the same during the first mode as during the second mode.

31. The method of claim 29, wherein the first and second transistor are field effect transistors and the first terminal is the gate, the second terminal is the source and the third terminal is the drain.

32. The method of claim 22, further including opening a first degeneration switch to disconnect the second terminal of one of the first and second transistors from ground when changing from the first mode to the second mode.

33. The method of claim 32, further including closing a gate switch to place a capacitor between the first terminal of the first transistor and the second terminal of the first transistor during the second mode.

34. The method of claim 32, further including opening a switch to disconnect a capacitor from between the first terminal of the first transistor and the second terminal of the first transistor during the first mode.

35. The method of claim 32, further including closing a gate switch to place a capacitor between the first terminal and the ground during the second mode.

36. The method of claim 32, further including opening a switch to disconnect a capacitor from between the first terminal of the first transistor and ground during the first mode.

\* \* \* \* \*